United States Patent [19]

Rhude

[11] 4,082,995

[45] Apr. 4, 1978

[54] CIRCUIT TESTER WITH RELIABLE INDICATION MEANS

[75] Inventor: John M. Rhude, Providence, R.I.

[73] Assignee: General Electric Company, New York, N.Y.

[21] Appl. No.: 672,204

[22] Filed: Mar. 31, 1976

[51] Int. Cl.² ............... G01R 31/02; G01R 19/16
[52] U.S. Cl. .................................. 324/51; 324/122
[58] Field of Search ............ 324/51, 122, 133, 66; 340/255, 252 R

[56] References Cited

U.S. PATENT DOCUMENTS

| 1,918,834 | 7/1933 | Crago | 324/122 |
| 2,429,764 | 10/1947 | Moore | 324/122 X |
| 2,917,705 | 12/1959 | Clough | 324/51 |
| 3,383,588 | 5/1968 | Stoll et al. | 324/51 |
| 3,513,393 | 5/1970 | Myers | 324/133 |
| 3,559,200 | 1/1971 | Walters | 324/51 X |
| 3,967,195 | 6/1976 | Averitt et al. | 324/133 X |

FOREIGN PATENT DOCUMENTS

| 1,089,064 | 9/1960 | Germany | 324/122 |
| 338,486 | 3/1936 | Italy | 324/122 |

Primary Examiner—Gerard R. Strecker
Attorney, Agent, or Firm—Paul E. Rochford; Walter C. Bernkopf

[57] ABSTRACT

An electrical circuit tester having hot, neutral and ground terminals adapted for connection to the hot, neutral and ground contacts, respectively, of a household electrical receptacle is provided with three glow lamps and three resistors connected in series with the glow lamps, each series combination of a glow lamp and a resistor being connected between a different pair of the terminals. Each glow lamp is shunted by an associated shunt resistor, the shunt resistor serving to lower the voltage across the glow lamp when full line voltage is impressed across a series combination of that glow lamp and any one other glow lamp.

1 Claim, 1 Drawing Figure

U.S. Patent      April 4, 1978      4,082,995
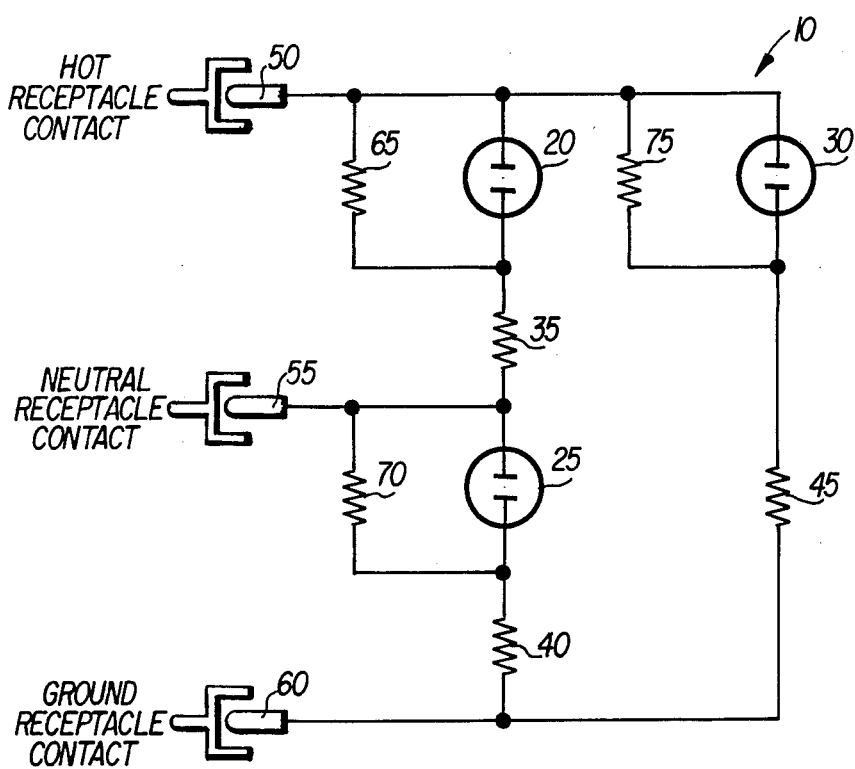

CIRCUIT TESTER WITH RELIABLE INDICATION MEANS

BACKGROUND OF THE INVENTION

1. Field of the Invention

This invention relates to an electrical circuit tester and more particularly to such a device used for testing the correctness of the wiring of electrical household outlets or receptacles.

2. Description of the Prior Art

Various circuit testers have been developed for testing the correctness of the wiring of three-wire ground type electrical household outlets or receptacles. A number of these devices comprise three lamps connected between the prongs of a three-prong standard plug and disposed within a suitable housing. When such a circuit tester is plugged into the outlet being tested the combinations of energized lamps indicate whether or not the wiring of the outlet is correct. However, under certain conditions of incorrect receptacle wiring, differing voltages are impressed across the various lamps employed in such prior art circuit testers. In certain of the prior art testers, the lamps having lower voltages impressed thereacross will flicker or glow more dimly than the lamps having higher voltages impressed thereacross. It is possible therefore, that under differing conditions of receptacle wiring, all the lamps will light, but in differing degrees of brightness, depending upon the wired condition of the receptacle. In can be seen then that one using such a prior art circuit tester must not only determine which lamps are lit when the prior art tester is inserted in the receptacle but must also determine the brightness of each lamp relative to the brightness of each of the other lamps. If the user is relatively unskilled at making such determinations, the possibility of error in interpreting the indication given by the lamps is substantial. Moreover, should the receptacle being tested be located in an area of relatively high ambient light, the determination of the relative brightness of each of the lamps with respect to each of the other lamps may be difficult even for one relatively skilled.

By the present invention, the above problems associated with the prior art are avoided, and an approach is provided in which, with each of the wiring conditions tested for, various combinations of the indicating lamps glow brightly, the remainder of the lamps not glowing at all. Therefore, the problem of determining the relative brightness of each of the lamps and thereby risking a mistaken conslusion as to the wired condition of the receptacle being tested is obviated.

It is therefore an object of the present invention to provide an electric circuit tester employing indicating lamps which glow brightly in various combinations, the remainder of the lamps not glowing at all.

SUMMARY OF THE INVENTION

In accordance with this invention in one form thereof, an electrical circuit tester having hot, neutral and ground terminals adapted for connection to the hot, neutral and ground contacts, respectively, of a household electrical receptacle is provided with three glow lamps and three resistors connected in series with the glow lamps, each series combination of a glow lamp and a resistor being connected between a different pair of the terminals. Each glow lamp is shunted by an associated shunt resistor, the shunt resistor serving to lower the voltage across the glow lamp to a value below the firing potential of that lamp when full line voltage is impressed across a series combination of that glow lamp and any one other glow lamp. Therefore, in each of the conditions tested for by the circuit tester of the present invention, the glow lamps either conduct and glow brightly or do not glow at all.

DESCRIPTION OF THE DRAWING

FIG. 1 is a schematic of the circuit employed in the circuit tester of the present invention.

DESCRIPTION OF THE PREFERRED EMBODIMENT

Referring to FIG. 1, there is provided an electrical circuit tester employing electrical circuit 10. Electrical circuit 10 comprises three neon glow lamps 20, 25 and 30 in series with three resistors 35, 40 and 45, respectively. Lamp 20 and resistor 35 are connected between hot and neutral terminals 50 and 55, respectively, of the circuit tester; lamp 25 and resistor 40 are connected between the neutral terminal 55 and ground terminal 60; and lamp 30 and resistor 45 are connected between the hot terminal 50 and the ground terminal 60. Lamps 20, 25 and 30 are shunted by resistors 65, 70 and 75, respectively.

When the circuit tester of the present invention is plugged into an ordinary three-wire ground type outlet or receptacle, the combinations of energized glow lamps will indicate whether or not the receptacle is correctly wired. For example, if the receptacle is corrrectly wired, connecting the circuit tester with the mating contacts of an outlet, places full line voltage across the combination of lamp 20 and resistors 35 and 65 and across the combination of lamp 30 and resistors 45 and 75. Since the neutral and ground contacts are both at ground potential, lamp 25 does not glow. Therefore, if lamps 20 and 30 glow when the circuit tester is plugged into the outlet, the user can readily determine that the outlet is correctly wired.

Similarly, if the receptacle is incorrectly wired such that the hot and neutral contacts are reversed, full line voltage will be placed across the combination of lamp 20 and resistors 35 and 65 and across the combination of lamp 25 and resistors 40 and 70. Sinch both sides of lamp 30 are at ground potential, this lamp will not glow. Therefore, if both lamps 20 and 25 glow when the testing device is plugged into the outlet, the user can determine that the polarities are reversed in the outlet.

Likewise, if the hot and ground connections are reversed in the outlet, full line voltage will be impressed across the combination of lamp 25 and resistors 40 and 70 and across the combination of lamp 30 and resistors 45 and 75. Since both sides of lamp 20 are at ground potential, this lamp will not glow. Therefore, if lamps 25 and 30 glow when the circuit tester is plugged into the receptacle being tested, the user can readily determine that the hot and ground connections within the receptacle are reversed.

However, should a condition of an open ground exist, full line voltage will be impressed across the combination of lamp 20 and resistors 35 and 65 and also across the combination of lamp 30 shunted by resistor 75, resistor 45, resistor 40, and lamp 25 shunted by resistor 70. Therefore, only 60 volts will be impressed across the combination of lamp 30 and resistors 45 and 75 and across the combination of lamp 25 and resistors 40 and 70. It can be seen that lamp 20 will glow brightly in this case. However, in prior art circuit testers testing a similar condition, the reduced voltage impressed across the combination of a lamp and a series resistor corresponding to lamp 25 and resistor 40 or lamp 30 and resistor 45 could cause these lamps to glow at a reduced brightness or flicker. Therefore, it may be difficult for the user to determine which lamps are glowing brighter than the other lamps, thereby risking an incorrect interpretation of the pattern of lighted lamps.

By the present invention, in a condition such as this, (open ground), resistors 70 and 75, shunting lamps 25 and 30, respectively, serve to lower the voltage across these lamps to a magnitude below the firing potential of these lamps. Therefore, in the circuit tester of the present invention, these lamps will not flicker or glow at all and the glowing of a single lamp (20) will indicate to the user that the ground connection in the receptacle is open thereby obviating any risk of error in making this interpretation.

Should the receptacle being tested be wired with the neutral contact open, full line voltage will be impressed across the combination of lamp 20 shunted by resistor 65, with resistor 35, lamp 25 shunted by resistor 70, with resistor 40. Resistors 65 and 70 shunting lamps 20 and 25, respectively, reduce the voltage across these lamps to a value below the firing potential of these lamps so that they will not flicker or glow at all. Since, in this case, full line voltage is impressed across the combination of lamp 30 shunted by resistor 75 and in series with resistor 45, this lamp will glow brightly indicating that the neutral connection in the receptacle is open. As in the case of an open ground, since only one bulb lights brightly and the remaining bulbs do not light at all, the user can easily determine that the neutral connection to the receptacle is open thereby obviating any risk of error of a misinterpretation of the indication given by the lamps.

Finally, in a condition where the hot connection is made to the neutral contact of the receptacle and the hot contact of the receptacle is unwired, full line voltage is impressed across the series combination of resistor 35, lamp 20 shunted by resistor 65, lamp 30 shunted by resistor 75, and resistor 45. Resistors 65 and 75 lower the potential across lamps 20 and 30, respectively, to a magnitude below the firing potential of these lamps preventing these lamps from flickering at all. Therefore, in this case, only lamp 25 will glow and since full line voltage is impressed across the series combination of lamp 25 shunted by resistor 70, and resistor 40, lamp 25 will glow brightly indicating that the hot contact of the receptacle is unwired and the hot connection is instead made to the neutral contact thereby obviating any risk of error in making this intepretation.

In one particular form of this invention, a suitable value for resistors 35, 40 and 45 is 120 K ohms, one-quarter watt; and for resistors 65, 70 and 75, 910 K ohms, one-quarter watt. Neon glow lamps 20, 25 and 30 may have a firing voltage of between 60 and 100 volts and rated at one-quarter watt.

It is recognized that certain testing apparatus have used resistors to shunt indicating lamps. However, such prior art testing apparatus do not, in all conditions being tested for, eliminate the problem of certain of the lamps flickering or glowing dimly as does the circuit tester of the present invention.

It can be seen then that the circuit tester of the present invention may be used to check for conditions of correct wiring; open ground; reversed polarity, open neutral; reversed hot and ground; and the hot wire connected to the neutral contact with the hot contact unwired, without the risk of a misinterpretation of the indication given by the lamps. By shunting all three glow lamps, flickering is prevented when full line voltage is impressed across the series combination of any two lamps and the associated series resistors connected thereto. Therefore, the risk of interpreting a flickering or dimly glowing lamp as being fully energized and therefore indicative of a certain wired condition of the receptacle being tested is completely obviated.

While there has been shown and described a specific embodiment of the circuit tester of the present invention, it will be apparent to those skilled in the art that modifications may be made without departing from the substance of this invention, and it is intended by the appended claims to cover such modifications as come within the spirit and scope of this invention.

I claim:

1. In a receptacle tester of the type having hot, neutral and ground terminals for connection to the hot, neutral and ground contacts of a three-wire ground type electrical receptacle, for testing the wired condition of the receptacle, the improvement comprising:

first, second, and third glow lamps, said first and third glow lamps being connected to said hot terminal of the receptacle tester and said second glow lamp being connected to said neutral terminal of the receptacle tester;

first, second and third series resistors, said first series resistor being connected between said first glow lamp and the neutral terminal, said second series resistor being connected between said second glow lamp and the ground terminal and said third series resistor being connected between said third glow lamp and the ground terminal; and first, second and third shunt resistors associated with and connected across said first, second and third glow lamps, respectively, each of said shunt resistors serving to prevent the firing of an associated glow lamp when full line voltage is impressed across a series combination of any two of said associated glow lamps.

* * * * *